(12) United States Patent
Maldonado et al.

(10) Patent No.: US 6,733,303 B2
(45) Date of Patent: *May 11, 2004

(54) LOW PITCH, HIGH DENSITY CONNECTOR (75) Inventors: Ralph Maldonado, Temecula, CA (US); Peter A. Kurbikoff, San Diego, CA (US); Thomas E. Mowry, Cardiff, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/356,064

(22) Filed: Jan. 30, 2003

(65) Prior Publication Data

US 2003/0114025 A1 Jun. 19, 2003

Related U.S. Application Data

(63) Continuation of application No. 09/843,476, filed on Apr. 26, 2001.

(51) Int. Cl.$^7$ ................................................ H01R 12/00
(52) U.S. Cl. ........................................ 439/66; 439/862
(58) Field of Search ............................ 439/66, 74, 862, 439/83

(56) References Cited

U.S. PATENT DOCUMENTS

| | | | |
|---|---|---|---|
| 3,518,612 A | 6/1970 | Dunman | |
| 3,795,037 A | 3/1974 | Luttmer | |
| 3,795,884 A | 3/1974 | Kotaka | |
| 3,858,154 A | 12/1974 | William | |
| 3,960,424 A | 6/1976 | Weisenburger | |
| 4,402,562 A | 9/1983 | Sado | |
| 4,445,735 A | 5/1984 | Bonnefoy | |
| 4,715,820 A | 12/1987 | Andrews | |
| 4,738,625 A | 4/1988 | Burton | |
| 4,998,886 A | 3/1991 | Werner | |
| 5,462,440 A | 10/1995 | Rothenberger | |
| 5,967,797 A | 10/1999 | Maldonado | |

*Primary Examiner*—Tho D. Ta
*Assistant Examiner*—Larisa Tsukerman
(74) *Attorney, Agent, or Firm*—Kirkpatrick & Lockhart LLP (57) ABSTRACT

The present invention is directed to an improved electrical connector for electrically connecting a first component to a second component. The connector includes a plurality of electrical conductors partially embedded in a dielectric frame. The frame is formed with a first side and a second side opposed to the first side. Each conductor includes a first finger, a second finger and a midsection connecting the first finger to the second finger. The midsection of each conductor is molded in place within the frame. The first finger of each conductor extends away from the first side of the frame while the second finger of each conductor extends away from the second side of the frame. The midsections of adjacent conductors can be spaced apart within the frame at distances of less than 1.5 mm.

6 Claims, 5 Drawing Sheets

LOW PITCH, HIGH DENSITY CONNECTOR

This application is a continuation of application Ser. No. 09/843,476, filed Apr. 26, 2001, which is currently pending. The contents of application Ser. No. 09/843,476 are incorporated herein by reference.

FIELD OF THE INVENTION

The present invention pertains generally to electrical connectors for electrically connecting the contacts of a first component to the contacts of a second component. More specifically, the present invention pertains to high density, miniature electrical connectors. The present invention is particularly, but not exclusively, useful as a miniature connector with an array of closely spaced conductors suitable for either compression or solder connection with circuit boards or their components.

BACKGROUND OF THE INVENTION

Electrical connectors can be used to connect one electronic component such as a microprocessor to another electronic component such as a printed circuit board. In modern equipment, electrical connectors capable of simultaneously connecting large numbers of electrical circuits from one electronic component to another are often required. Typically, for such an application, the electrical connector includes a frame having two opposed contact surfaces. Each contact surface on the connector is provided for engagement with a corresponding contact surface on one of the electronic components. The connector frame functions to both hold the midsections of a plurality of individual electrical conductors, and to electrically isolate each conductor from the remaining conductors. Also, the frame generally incorporates features for mechanically attaching the electronic components to one another. Heretofore, connectors having conductors that are molded-in-place within the frame have been widely used. In these connectors, each conductor has a first finger that projects from one side of the frame and a second finger that projects from the other side of the frame. The midsection of each conductor connects the first finger to the second finger.

A typical mold-in-place conductor is manufactured by first stamping an array of conductors from a sheet of metal. Generally, the conductors are stamped with the flat midsection of each conductor remaining essentially in the plane of the original sheet, and the fingers of the conductor projecting from the plane of the original sheet. Next, the array of conductors is placed in a mold and molten plastic is injected into the mold cavity to mold the midsections of each conductor in place and to create a frame having opposed contact surfaces. The result is a connector having the flat midsection of each conductor oriented substantially parallel to the contact surfaces of the frame. These mold-in-place conductors have established an excellent reputation for reliability throughout the electronics industry. Specifically, these connectors provide an acceptable signal to ground ratio with little or no measurable crosstalk between conductors.

In modern equipment, electronic components have become increasingly miniaturized, while the number of circuits in each electronic component has multiplied. These effects have combined to require smaller connectors having smaller spacings between adjacent conductors. Unfortunately, for mold-in-place connectors, small spacings between adjacent conductors are not readily obtainable when the conductor midsections are oriented parallel to the contact surfaces of the frame.

In addition to close conductor spacing, connectors that have long fingers are generally prescribed to provide for good wiping action with the land of the electronic component. In typical mold-in-place conductors manufactured by the process described above, small spacings between conductors are generally unobtainable when long fingers are prescribed. Specifically, this occurs because during stamping, the fingers are formed between midsections of adjacent conductors, and the spacing between adjacent midsections is maintained between the stamping and the molding steps. Consequently, in typical mold-in-place conductors manufactured by the process described above, an increase in finger length generally must be accompanied by an increase in spacing between adjacent conductors.

Another common method of manufacturing connectors, called stitching, involves molding a plastic frame containing a plurality of apertures, and then "stitching" the individual contacts into the apertures of the solid frame. Generally, the conductor midsections can be oriented in the frame perpendicular to the contact surface of the frame. Consequently, close spacing between conductors is generally not limited by midsection orientation. However, stitched connectors have different performance characteristics than mold-in-place connectors and have not established industry wide acceptance. For example, the presence of a large number of apertures within the frame affects both the electrical characteristics and the structural capabilities of the frame.

In light of the above, it is an object of the present invention to provide an electrical connector having hundreds of reliable mold-in-place conductors spaced at less than 1.5 mm from each other. Another object of the present invention is to provide a connector having relative dimensions, such as the dimensional relationship between the spacing between adjacent conductors and the length of each conductor finger, that are not constrained due to the orientation of the midsection in the frame. Yet another object of the present invention is to provide electrical connectors which are easy to use, relatively simple to manufacture and comparatively cost effective.

SUMMARY OF THE INVENTION

The present invention is directed to an electrical connector for electrically connecting a plurality of contact lands on a first component to a plurality of contact lands on a second component. The electrical connector includes a plurality of electrical conductors, each conductor partially embedded in a molded frame made from a dielectric material.

The frame is formed with a first side having a plurality of substantially coplanar first surfaces. Further, the first side is formed with a plurality of parallel first channels, with each first channel positioned between a pair of coplanar first surfaces. Consequently, the first side is composed of a plurality of first surfaces and a plurality of first channels. Additionally, the frame is formed with a second side opposed to the first side. The second side also has a plurality of substantially coplanar second surfaces. The frame is constructed with the second surfaces of the second side substantially parallel to the first surfaces of the first side. Like the first side, the second side is also formed with a plurality of parallel second channels, with each second channel positioned between a pair of coplanar second surfaces.

Each channel is formed with a first wall, a second wall and a bottom. Further, the walls and bottom of each channel are substantially flat. The first wall extends from a surface of the side to the bottom of the channel. Further, the first wall is substantially perpendicular to both the surface of the side, and to the bottom of the channel. Consequently, the bottom of the channel is substantially parallel to the surface of the side. Similarly, the second wall extends from a surface of the side to the bottom of the channel, and the second wall is substantially perpendicular to both the surface of the side and the bottom of the channel.

Each channel defines an axis plane. Specifically, the axis plane of each channel is parallel to the walls of the channel and is located generally midway between the walls of the channel. For the first side of the frame, each first channel defines a first axis plane. Similarly, for the second side of the frame each second channel defines a second axis plane.

Each conductor includes a first finger, a second finger and a midsection connecting the first finger to the second finger. The midsection of each electrical conductor is fully encapsulated by the frame. Preferably, the midsections of each electrical conductor are substantially flat. In the preferred embodiment, the midsection of each electrical conductor is molded in place within the frame with the flat midsection oriented perpendicular to both the first surface of the first side, and also, the first axis plane of each first channel.

Each finger is formed with a tip. Preferably, the first finger of the electrical conductor extends from the bottom of a first channel and into the first channel. Further, each first finger extends from the first side of the frame to the tip of each first finger. Similarly, in the preferred embodiment, the second finger of the electrical conductor extends from the bottom of a second channel and into the second channel. Like the first fingers, each second finger also extends from the second side of the frame to a tip of each second finger.

Additionally, the conductors are oriented within the frame with the tip of each first finger lying in a first axis plane and the tip of each second finger lying in a second axis plane. Consequently, a single conductor extends into both a first channel having a first axis plane and a second channel having a second axis plane. Stated differently, each single conductor shares a first channel and a second channel. In one embodiment of the present invention, the shared first and second channels are aligned. For purposes of the present disclosure, two channels are aligned if the axis plane of the first channel is coplanar with the axis plane of the second channel. In another embodiment of the present invention, the shared first and second channels are laterally offset. Specifically, for purposes of the present disclosure, two channels are laterally offset if the axis plane of the first channel is separated from the axis plane of the second channel by a nonzero distance.

Each finger may be shaped to facilitate electrical connection with the contact lands of a mating electronic component. In one embodiment of the present invention, the finger can be shaped for compression connection with a contact land of a component. In this embodiment, the finger is curved from the bottom of the channel to the tip of the finger. A curled contact surface is provided at or near the tip of the finger for contact with the land of a component. Specifically, the finger is curved to allow the contact surface on the finger to extend slightly beyond the surface of the frame. In other words, the finger is curved such that the distance between the contact surface on the finger and the bottom of the channel is slightly greater than the distance between the surface of the frame and the bottom of the channel. This configuration allows the contact land of a component to compress the finger of the conductor whenever the contact land is seated onto the surfaces of the frame. Alternatively, the contact surface of the finger can be dimensioned to bridge a VIA hole on a printed circuit board. In another embodiment of the present invention, the finger is shaped to allow the finger to be surface mount soldered to a contact land of a component. In this configuration, the finger is shaped such that a portion of the finger near the tip is approximately parallel to the surface of the side. Alternatively, vertical fingers can make an electrical connection to the contact ball of a ball grid array, or parallel shaped fingers could be soldered to the contact ball of a ball grid array.

Importantly, in the connector of the present invention, the conductors can be closely spaced. In particular, two conductors each having their respective first fingers in a single first channel can be spaced less than 1.5 mm apart. Specifically, the flat midsections of the conductors can be spaced less than 1.5 mm apart. Further, the connector of the present invention allows for fingers having curvelengths exceeding 1.5 mm while maintaining midsection spacings at less than 1.5 mm. For purposes of the present disclosure, the curvelength of a finger is the distance measured along the finger from the bottom of the channel to the tip of the finger.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
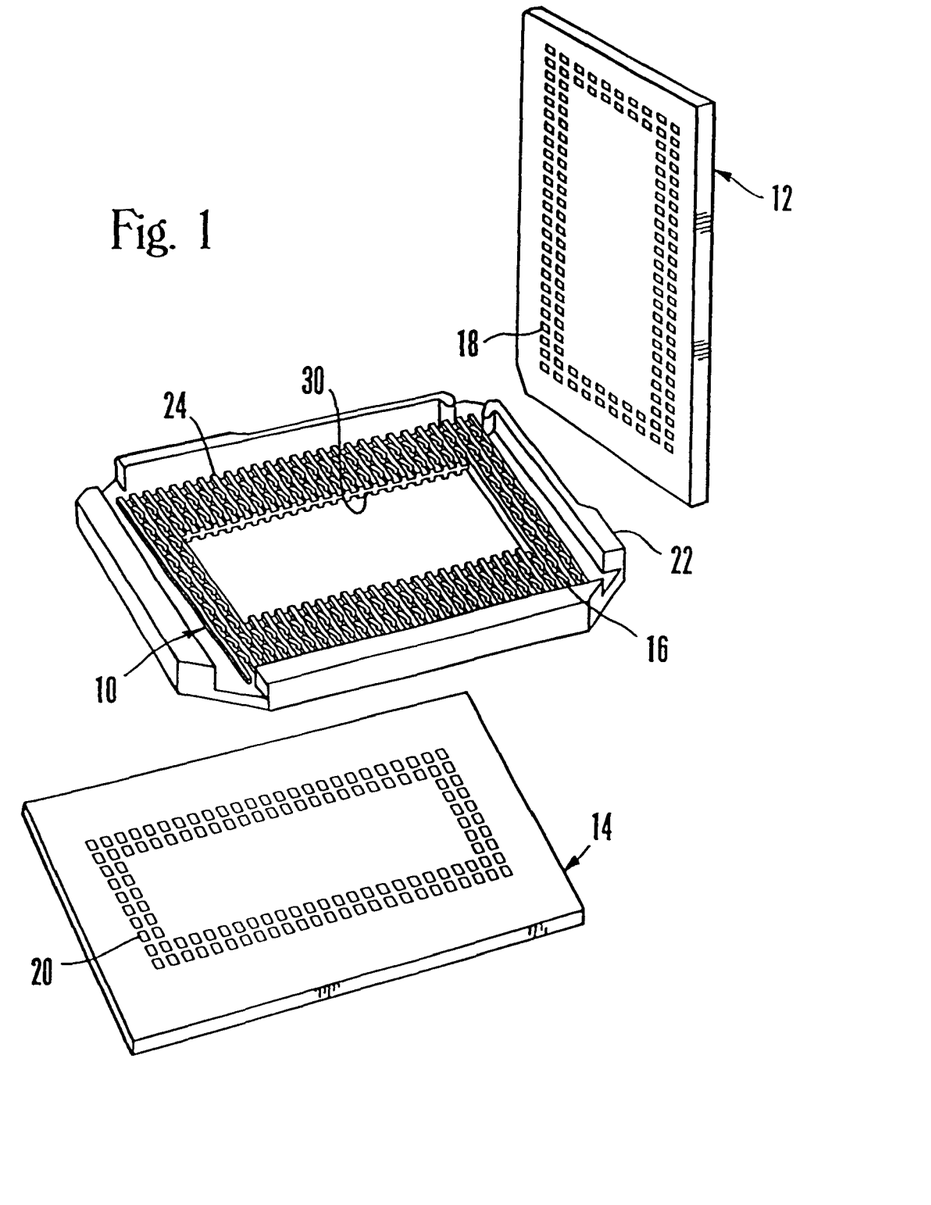
FIG. 1 is a perspective view of an electrical connector having features of the present invention shown together with two electronic components.

Referring to FIG. 1, an electrical connector in accordance with the present invention is shown and designated 10. A first component 12 and a second component 14 are also shown in FIG. 1. As provided herein, the electrical connector 10 electrically connects the first component 12 to the second component 14. The electrical connector 10 disclosed herein can also be referred to as a "microprocessor connector," a "socket," an "interposer" or a "land grid array" (LGA) socket.

As shown, the electrical connector 10 includes a plurality of spaced apart electrical conductors 16. Similarly, the first component 12 includes a plurality of spaced apart contacts 18 and the second component 14 includes a plurality of spaced apart contacts 20. For the present invention, the contacts 18, 20 can be lands/pads of various shapes and sizes. In the embodiment illustrated, each first contact 18 is a land and is a rectangular shaped flat surface. The plurality of lands constitute a "land grid array." Alternatively, the contacts 18, 20 on the components 12, 14 can be constructed as balls or lands having a VIA hole (see discussion below). Also, as further described below, the conductors 16 may be either soldered or compression connected to the contacts 18, 20.

As shown in FIG. 1, each electrical conductor 16 in the electrical connector 10 establishes an individual electrical circuit between a first contact 18 on the first component 12 and a second contact 20 on the second component 14. Also shown, the electrical connector 10 includes a frame 22 to isolate each electrical conductor 16 from the remaining electrical conductors 16. The shape, size and design of the frame 22 can be varied to be compatible with a particular first component 12 and a particular second component 14. The first component 12 and second component 14 illustrated in FIG. 1 are provided merely to facilitate this discussion. As contemplated for the present invention, the components 12, 14 may be a computer microprocessor, ASIC device or printed circuit board (PCB) or any other electronic component requiring a plurality of electrical connections with another component.

Figure 2:
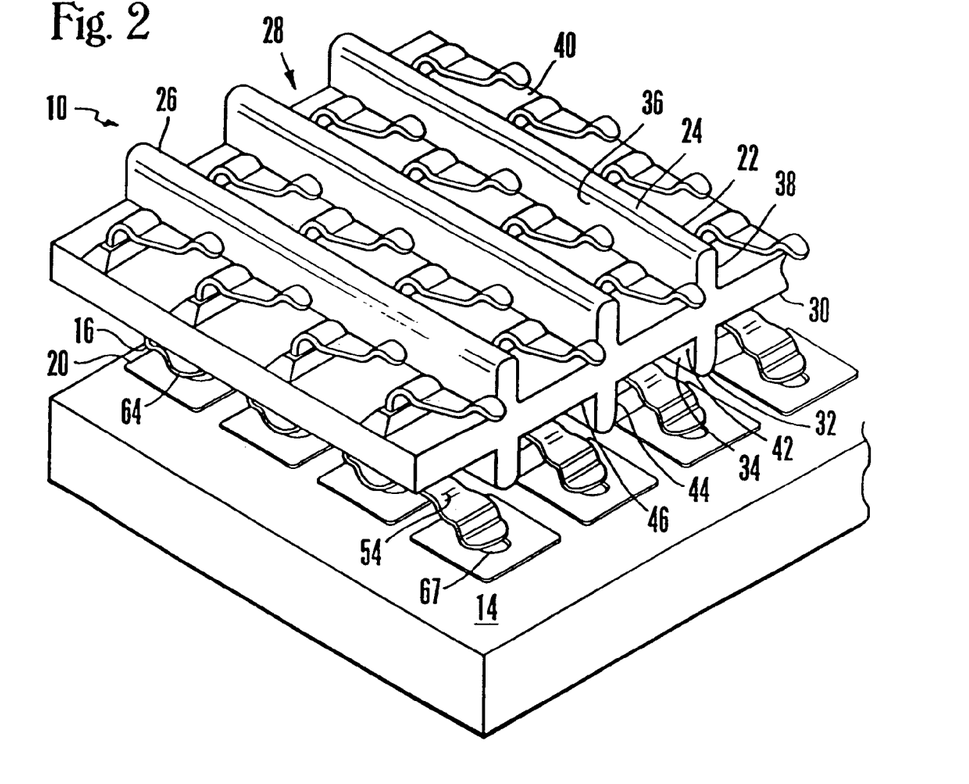
FIG. 2 is a side perspective view of a portion of an electrical connector in contact with a portion of an electronic component, with a portion of the frame shown in partial cross-section for clarity.

FIG. 2 illustrates an enlarged view of a portion of an electrical connector 10 in contact with a representative contact 20 of second component 14. As shown, the electrical connector 10 includes a plurality of electrical conductors 16. Each electrical conductor 16 is partially embedded in the molded frame 22. The molded frame 22 is preferably made from a rigid, substantially dielectric, non-conducting material, such as a thermoplastic.

Also shown, the frame 22 is formed with a first side 24 for contact with a first component 12 (shown in FIG. 1) having a plurality of substantially coplanar first surfaces 26. Further shown in FIG. 2, the first side 24 is formed with a plurality of parallel first channels 28 which are positioned between the plurality of coplanar first surfaces 26. As seen in FIG. 2, the first side 24 is composed of a plurality of first surfaces 26 and a plurality of first channels 28. Additionally, the frame 22 is formed with a second side 30 opposed to the first side 24 for contact with a second component 14 (shown in FIG. 1). As shown in FIG. 2, the second side 30 also has a plurality of substantially coplanar second surfaces 32. The frame 22 is constructed with the plurality of second surfaces 32 of the second side 30 substantially parallel to the plurality of first surfaces 26 of the first side 24. Like the first side 24, the second side 30 is also formed with a plurality of parallel second channels 34 which are positioned between the plurality of coplanar second surfaces 32.

Preferably, each first channel 28 is formed with a first wall 36, a second wall 38 and a bottom 40. As shown, in the preferred embodiment of the present invention, the walls 36, 38 and the bottom 40 of each first channel 28 are substantially flat. For each first channel 28, the first wall 36 extends from a first surface 26 of a first side 24 to the bottom 40 of a first channel 28. Further, each first wall 36 is substantially perpendicular to both the first surface 26 of the first side 24 and the bottom 40 of each first channel 28. Consequently, the bottom 40 of each first channel 28 is substantially parallel to the first surface 26 of each first side 24. Similarly, each second wall 38 extends from a first surface 26 of a first side 24 to a bottom 40 of a first channel 28, and each second wall 38 is substantially perpendicular to both the first surface 26 of the first side 24 and the bottom 40 of each first channel 28.

Similarly, each second channel 34 is preferably formed with a first wall 42, a second wall 44 and a bottom 46. As shown in FIG. 2, in the preferred embodiment of the present invention, the walls 42, 44 and the bottom 46 of each second channel 34 are substantially flat. For each second channel 34, the first wall 42 extends from a second surface 32 of a second side 30 to the bottom 46 of a second channel 34. Further, each first wall 42 is substantially perpendicular to both the second surface 32 of the second side 30 and the bottom 46 of each second channel 34. Consequently, the bottom 46 of each second channel 34 is substantially parallel to the second surface 32 of each second side 30. Similarly, each second wall 44 extends from a second surface 32 of a second side 30 to a bottom 46 of a second channel 34, and each second wall 44 is substantially perpendicular to both the second surface 32 of the second side 30 and the bottom 46 of each second channel 34.

Figure 3:
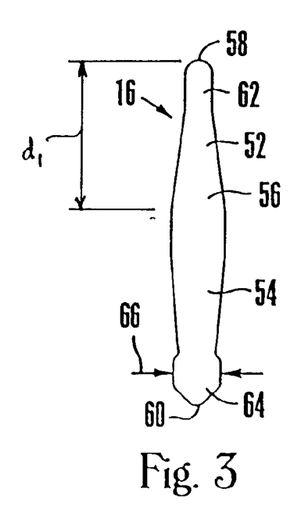
FIG. 3 is an elevational view of an electrical conductor having one finger for compression connection with a contact land and one finger for compression connection with a contact land having a VIA hole.

FIG. 3 shows a representative electrical conductor 16 as formed, before the conductor 16 is molded in place within a frame 22 to create an electrical connector 10. As shown, the electrical conductor 16 includes a first finger 52, a second finger 54 and a midsection 56 connecting the first finger 52 to the second finger 54. Further, as shown in FIG. 3 and indicated in FIG. 4, the first finger 52 extends from the midsection 56 through a curvelength "$d_1$" and terminates in a tip 58. A curled contact surface 62 is provided between the midsection 56 and the tip 58 for direct contact with the contact 18 of the component 12. Similarly, the second finger 54 extends from the midsection 56 and terminates in a tip 60. As shown, contact surface 64 is provided having a suitable width 66 for bridging a VIA hole 67 (shown in FIG. 2). The representative electrical conductor 16 shown in FIG. 3 is shown as-stamped and before any shaping operation is performed on the fingers 52, 54 of the electrical conductor 16. The electrical conductor 16 may be made from an electrically conductive metal spring material, such as BeCu 172. In the preferred embodiment, the electrical conductors 16 are stamped or formed from strips that are approximately 0.001 to 0.003 inches in thickness. Further, portions of the electrical conductor 16, or the entire electrical conductor 16, may be completely or selectively gold-plated on one side to a thickness of between 3 and 50 micro-inches to enhance the conductivity of the conductor 16.

Figure 4:
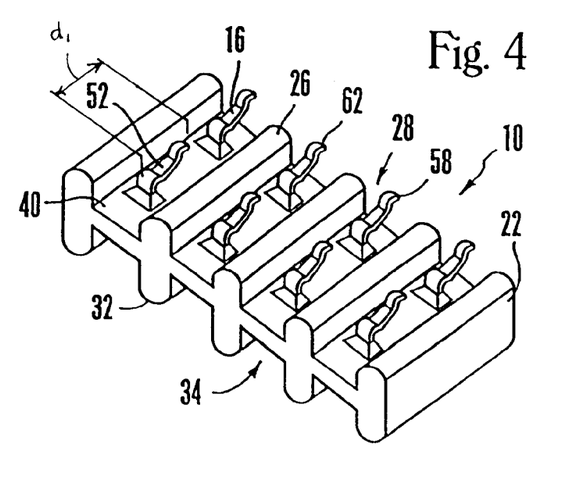
FIG. 4 is a perspective view of a portion of an electrical connector having features of the present invention.
Figure 5:
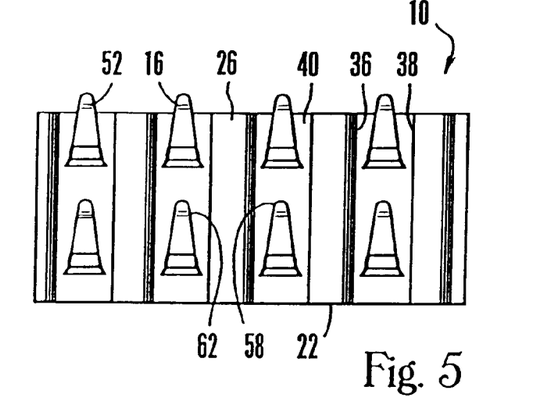
FIG. 5 is a top plan view of a portion of an electrical connector having features of the present invention.
Figure 6:
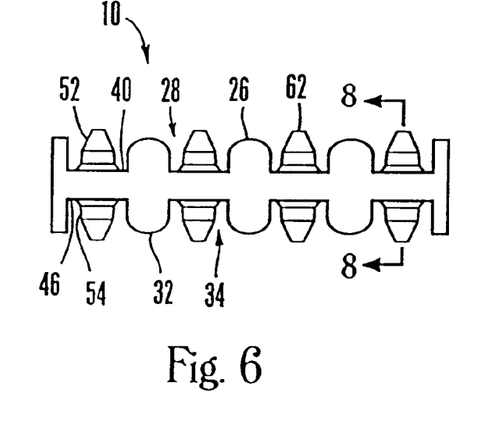
FIG. 6 is an front elevational view of a portion of an electrical connector having features of the present invention.

As further shown by cross-referencing FIGS. 4 through 6, once the conductor 16 is molded in place within the frame 22, the first finger 52 of the electrical conductor 16 extends from the bottom 40 of the first channel 28 and into a first channel 28. Also, as shown, the first finger 52 extends from the bottom 40 of a first channel 28 to the tip 58 of the first finger 52. Similarly, the second finger 54 of the electrical conductor 16 extends from the bottom 46 of a second channel 34 and into a second channel 34. Also, as shown in FIG. 7, the second fingers 54 extend from the bottom 46 of a second channel 34 to the tip 60 of the second finger 54.

Figure 7:
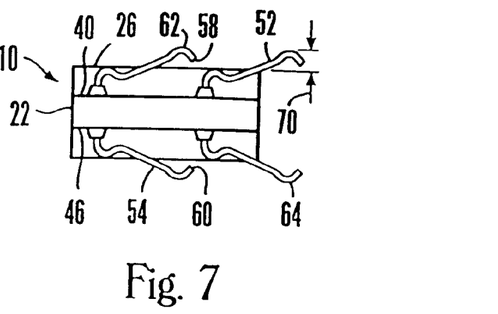
FIG. 7 is a side elevational view of a portion of an electrical connector having features of the present invention.
Figure 8:
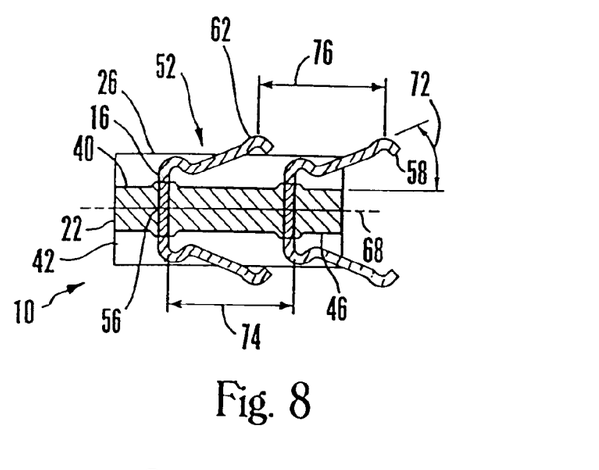
FIG. 8 is a cross-sectional view of the electrical connector as seen along line 8—8 in FIG. 6, showing the conductor midsection molded in place within the frame.

By cross referencing FIGS. 6 through 8, it can be seen that in the preferred embodiment of the present invention, the midsection 56 of each electrical conductor 16 is molded in place within the frame 22. Further, FIG. 8 shows that after the frame 22 is formed around the midsections 56, each midsection 56 can be substantially flat. FIG. 8 further shows that in the preferred embodiment, the midsection 56 of the electrical conductor 16 is fully encapsulated within the frame 22 with the flat midsection 56 oriented perpendicular to each first surface 26. As shown in FIG. 8, the frame 22 can define a linear axis 68 that extends parallel to the first side 24 and passes through the midsections 56 of one or more adjacent conductors 16. Still referring to FIG. 8, it can be seen that the conductors 16 can be oriented in the frame 22 with the flat midsection 56 normal to the linear axis 68.

In the embodiment shown in FIGS. 1 through 8, the fingers 52, 54 are shaped for compression connection with a contact 18, 20 that is formed as a land. The shaping may be performed before or after the midsection 56 of the conductors 16 are molded in place within the frame 22. As shown by cross-referencing FIGS. 6 and 7, in this embodiment, the first finger 52 is curved from the bottom 40 of the first channel 28 to the tip 58 of the first finger 52. Specifically, the first finger 52 is curved to allow the curled contact surface 62 to extend a distance 70 of approximately 0.003 to 0.020 inches beyond the first surface 26 of the first side 24. In other words, the first finger 52 is curved such that the distance between the contact surface 62 and the bottom 40 of the first channel 28 exceeds the distance between the first surface 26 and the bottom 40 of the first channel 28 by approximately 0.003 to 0.020 inches. This configuration allows for compression contact with a contact 18 of an electrical component 12 that is formed as a land. As shown in FIG. 8, the first finger 52 is preferably curved until the angle 72 between the first finger 52 and the bottom 40 of the first channel 28 is approximately 10 to 60 degrees.

In use, the electrical connector 10 with fingers 54 shaped for compression connection can be placed adjacent to an electrical component 14, as shown in FIG. 2. Specifically, the electrical connector 10 can be placed adjacent to an electrical component 14 with the curled contact surface 64 of the second finger 54 placed in contact with the contact 20 of the electrical component 14. Next, the contact 20 of the electrical component 14 can be pressed against the curled contact surface 64 of the finger 54, deflecting the finger 54 until the contact 20 rests flush against the second surfaces 32. Upon locking the frame 22 of the electrical connector 10 against the component 14, the elasticity of the conductor 16 will hold the conductor 16 against and in contact with the contact 20.

Importantly, in the electrical connector 10 of the present invention, the electrical conductors 16 can be closely spaced. In particular, referring now to FIG. 8, electrical conductors 16 having first fingers 52 in a single first channel 28 can be spaced apart at a pitch distance 74 of less than 1.5 mm. Also, as shown in FIG. 8, the electrical connector 10 of the present invention allows for the distance 76 between the tip 58 of one conductor 16 and the tip 58 of an adjacent conductor 16 to be 1.5 mm or smaller. Specifically, the flat midsections 56 of adjacent electrical conductors 16 lying on the same linear axis 68 can be spaced apart at a pitch distance 74 of less than 1.5 mm. Further, an electrical connector 10 in accordance with the present invention can be prepared having fingers 52, 54 with curvelengths exceeding 1.5 mm and conductors 16 spaced at a pitch distance 74 of less than 1.5 mm. For purposes of the present disclosure, the curvelength of a finger 52, 54 is the distance measured along the finger 52 from the bottom 40 of channel 28 to the tip 58 of the finger 52.

Figure 9:
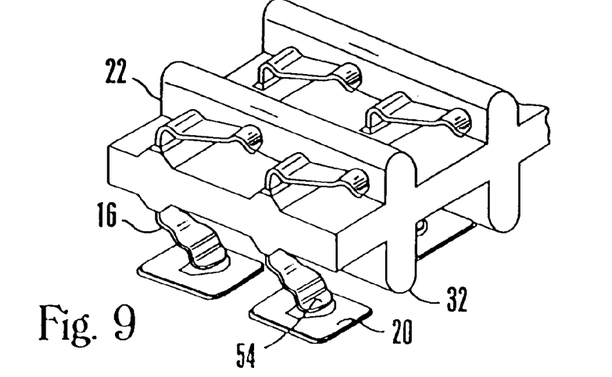
FIG. 9 is a perspective view of a portion of an electrical connector having features of the present invention, showing an embodiment having conductors suitable for surface mount soldering to one component and compression connection with another component.
Figure 10:
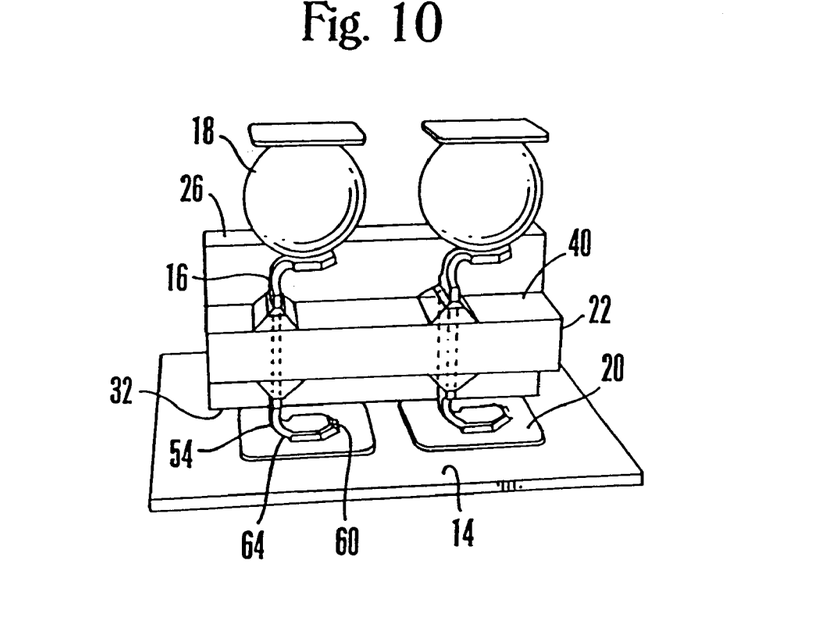
FIG. 10 is a perspective view of a portion of an electrical connector having features of the present invention showing an embodiment having conductors suitable for surface mount soldering to one component having a land grid array and another component having a ball grid array.
Figure 11:
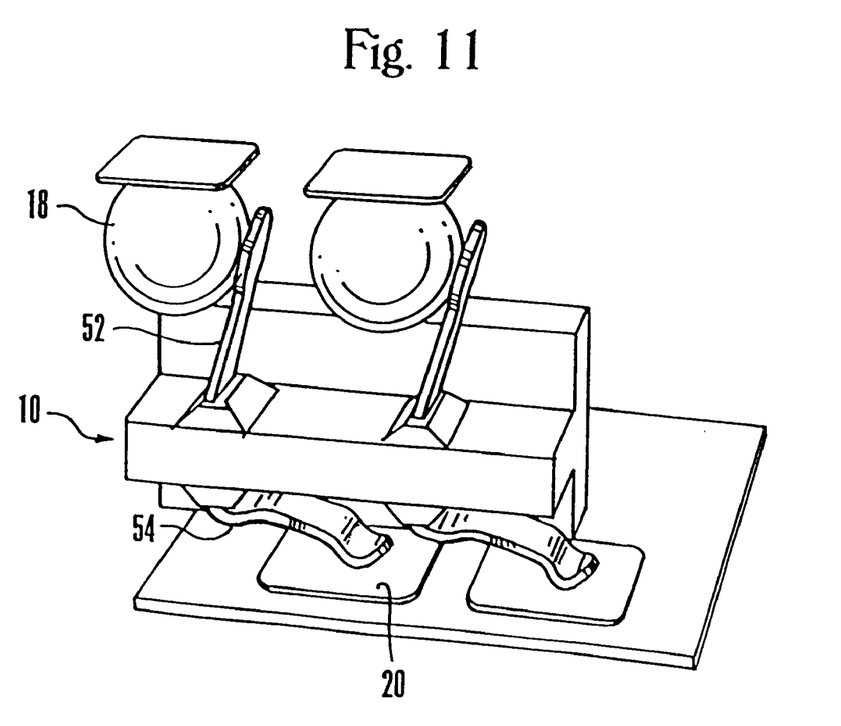
FIG. 11 is a perspective view of a portion of an electrical connector having features of the present invention, showing an embodiment having conductors suitable for side compression connection with a component having a ball grid array and compression connection with a component having a land grid array.

Referring now to FIG. 9, the electrical connector 10 is shown with one conductor 16 surface mount soldered (SMT) to an electronic component 14, such as a printed circuit board (PCB). Further, it is to be appreciated that both fingers 52, 54 can be surface mount soldered (SMT) to their respective components. Referring now to FIG. 11, the conductor 16 is shown molded in place within a frame 22, and the second finger 54 is shown soldered to a contact 20 that is shaped as a land. In this configuration the finger 54 is shaped such that the contact surface 64 of the finger 54 near the tip 60 is parallel to the second surface 32 of the frame 22. Alternatively, the finger 54 can be soldered to a contact 18 that is shaped as a ball as shown in FIG. 10. For the present invention, the ball can be part of a ball grid array. Referring now to FIG. 11, an electrical connector 10 in accordance with the present invention is shown having a first finger 52 configured for side compression contact with a contact 18 that is a ball of a ball grid array. As shown, the second finger 54 is configured for compression connection with a contact 20 that is a land of a land grid array. By cross-referencing FIGS. 8, 9, 10 and 11, it can be appreciated that in all of these embodiments, the pitch distance 74 between midsections 56 of adjacent conductors 16 lying on the same linear axis 68 (as defined above for frame 22) can be less than 1.5 mm.

Figure 12:
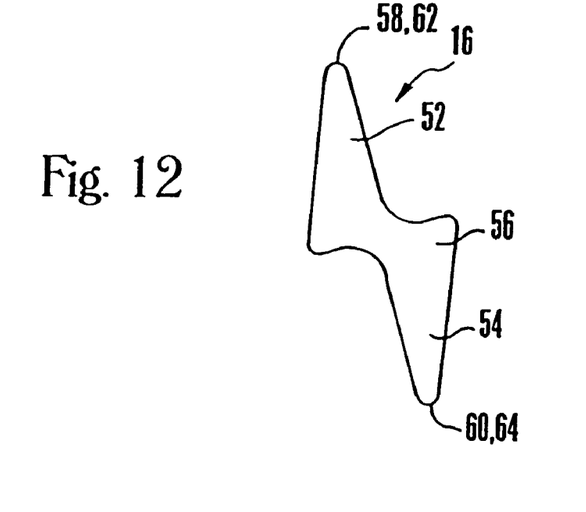
FIG. 12 is an elevational view of an electrical conductor having offset fingers.
Figure 13:
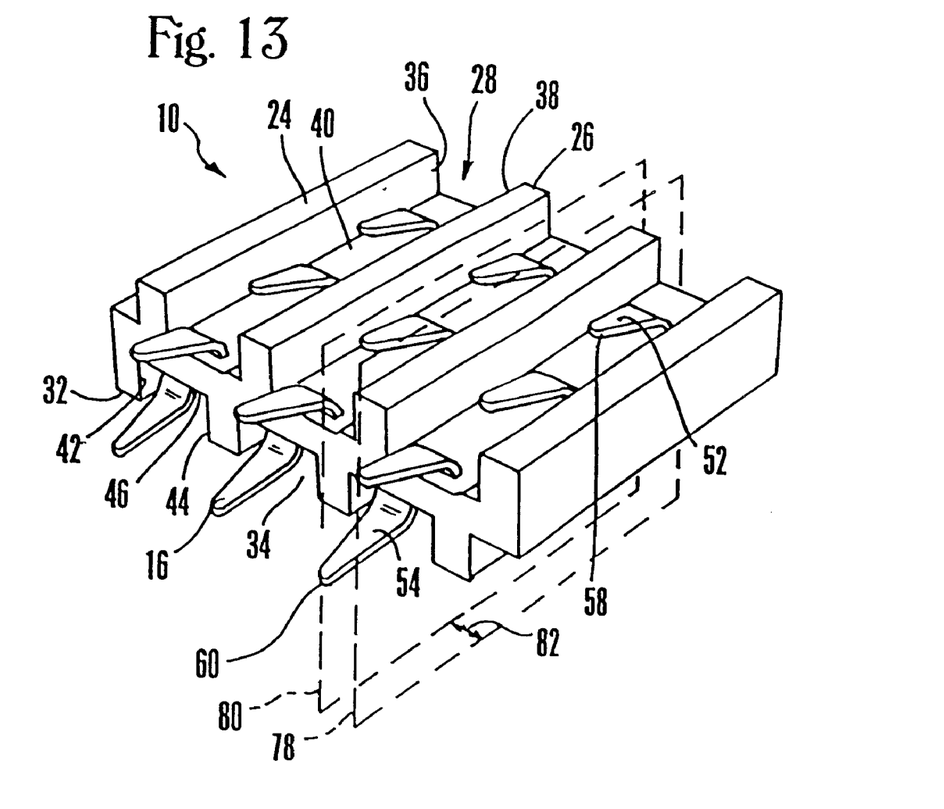
FIG. 13 is a perspective view of a portion of an electrical connector having features of the present invention showing an embodiment having offset channels and conductors having offset fingers.

In yet another embodiment of the present invention, shown in FIGS. 12 and 13, a frame 22 having offset channels 28, 34 can be used with conductors 16 having offset fingers 52, 54. Specifically, as shown, each first channel 28 has a first axis plane 78 and each second channel 34 has a second axis plane 80. More specifically, the first axis plane 78 of each first channel 28 is parallel to the walls 36, 38 of the first channel 28 and located midway between the walls 36, 38 of the first channel 28. Similarly, the second axis plane 80 of each second channel 34 is parallel to the walls 42, 44 of the second channel 34 and located midway between the walls 42, 44 of the second channel 34. Further, by cross-referencing FIGS. 12 and 13, it can be seen that the electrical conductor 16 is molded in place within the frame 22 with the flat midsection 56 oriented perpendicular to the first axis plane 78 of each first channel 28.

Referring now to FIG. 13, the electrical conductors 16 are oriented within the frame 22 with the tip 58 of the first finger 52 lying in the first axis plane 78 and the tip 60 of the second finger 54 lying in the second axis plane 80. Consequently, a single conductor 16 extends into both a first channel 28 having a first axis plane 78 and a second channel 34 having a second axis plane 80. In this embodiment, a single conductor 16 shares a first channel 28 and a second channel 34, and further, the shared first channel 28 and second channel 34 are laterally offset. Specifically, for purposes of the present disclosure, a first channel 28 is laterally offset from a second channel 34 if the first axis plane 78 of the first channel 28 is separated from the second axis plane 80 of the second channel 34 by a distance 82 that is nonzero. It is to be appreciated that in this embodiment, conductors 16 suitable for soldering or compression connection can be used. Further, in this embodiment, the distance between midsections 54 of adjacent conductors 16 having fingers 52, 54 lying in the same axis plane 78, 80 can be less than 1.5 mm.

A suitable method for making the electrical connector 10 of the present invention follows. First, flat electrical conductors 16 as shown in FIG. 3 may be stamped from a sheet, or manufactured by any method known in the pertinent art. Then, a plurality of conductors 16 can be inserted into a mold half (not shown) containing recesses to receive the first fingers 52 of each conductor 16. Next, a second mold half containing recesses can be positioned to receive the second fingers 54 of each conductor 16 and form a cavity between the mold halves, with only the midsections 56 of the conductors 16 exposed in the cavity. A plastic material can be injected into the cavity of the mold to create an insulating frame 22 around the midsections 56 of the conductors 16. Finally, the fingers 52, 54 which protrude straight from the frame 22 after molding, can be shaped to produce an electrical connector 10 suitable for compression connection or surface mount soldering with an electrical component 12,14.

While the particular Low Pitch, High Density Connector as herein illustrated and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A connector for electrically connecting a first component with a second component, said connector comprising:

a frame having a first side and an opposed second side with a channel formed on said first side; and a first conductor and a second conductor, each said conductor formed with a first finger for contact with the first component, a second finger for contact with the second component and a flat midsection connecting said first finger to said second finger, each said midsection being molded in place within said frame, said flat midsection of said first conductor defining a midsection plane with said first finger thereof projecting from said channel and out of said midsection through a curvelength ($d_1$), and with said midsections of said first and second conductors oriented parallel to each other and normal to a common linear axis passing through each said midsection, with said midsection of said first conductor being spaced less than 1.5 mm from said midsection of said second conductor, wherein said first finger is extendable through said curvelength ($d_1$) substantially from said midsection of said first conductor to said second conductor, in a direction along said common linear axis.

2. A connector as recited in claim 1 wherein said first finger extends from said first side of said frame to a contact surface for contact with said first component and defines a curvelength distance measured along said first finger from a point where said first finger contacts said frame to said contact surface, and wherein said distance is greater than 1.5 mm.

3. A connector as recited in claim 1 wherein said frame is comprised of a dielectric material.

4. A connector as recited in claim 1 wherein said conductors are made of a solid metallic material.

5. A connector as recited in claim 1 wherein said first fingers of said conductors are shaped for compression connection with the first component.

6. A connector as recited in claim 1 wherein said first fingers of said conductors are formed with a flat portion for solder connection with the first component.

* * * * *